(12) United States Patent
Fork et al.

(10) Patent No.: US 8,322,025 B2
(45) Date of Patent: Dec. 4, 2012

(54) APPARATUS FOR FORMING A PLURALITY OF HIGH-ASPECT RATIO GRIDLINE STRUCTURES

(75) Inventors: David K. Fork, Los Altos, CA (US); Thomas S. Zimmermann, Jena (DE)

(73) Assignee: SolarWorld Innovations GmbH, Freiberg (DE)

( * ) Notice: Subject to any disclaimer, the term of this patent is extended or adjusted under 35 U.S.C. 154(b) by 210 days.

(21) Appl. No.: 11/555,479

(22) Filed: Nov. 1, 2006

(65) Prior Publication Data
US 2008/0102558 A1    May 1, 2008

(51) Int. Cl.
  B05C 11/02    (2006.01)
  B28B 21/52    (2006.01)
(52) U.S. Cl. ............ 29/729; 29/745; 118/314; 118/323; 425/197; 425/463
(58) Field of Classification Search ............ 29/729, 29/527.1, DIG. 47, 745; 72/253.1; 118/313, 118/314, 315, 316, 323, 325; 425/197, 463
See application file for complete search history.

(56) References Cited

U.S. PATENT DOCUMENTS

| | | |
|---|---|---|
| 2,031,387 A | 2/1936 | Schwarz |
| 2,326,803 A | 8/1943 | Samiran |
| 2,761,791 A | 9/1956 | Russell |
| 2,789,731 A | 4/1957 | Marraffino |
| 3,032,008 A | 5/1962 | Land et al. |
| 3,159,313 A | 12/1964 | Guilford |
| 3,602,193 A * | 8/1971 | Adams et al. ............ 118/315 |
| 3,973,994 A | 8/1976 | Redfield |
| 3,988,166 A | 10/1976 | Beam |
| 4,018,367 A | 4/1977 | Morine et al. |
| 4,021,267 A | 5/1977 | Dettling |
| 4,045,246 A | 8/1977 | Mlavsky et al. |
| 4,053,327 A | 10/1977 | Meulenberg, Jr. |
| 4,084,985 A | 4/1978 | Evans, Jr. |
| 4,086,485 A | 4/1978 | Kaplow et al. |
| 4,095,997 A | 6/1978 | Griffiths |
| 4,119,058 A | 10/1978 | Schmermund |
| 4,131,485 A | 12/1978 | Meinel et al. |
| 4,141,231 A * | 2/1979 | Kudlich ............ 118/323 X |
| 4,148,301 A | 4/1979 | Cluff |

(Continued)

FOREIGN PATENT DOCUMENTS

CN    2606309 Y    3/2004

(Continued)

OTHER PUBLICATIONS

Alvarez et al. "RXI Concentrator For 1000X Photovoltaic Energy Conversion".

(Continued)

*Primary Examiner* — A. Dexter Tugbang

(57) ABSTRACT

Closely spaced, high aspect-ratio gridline structures are formed on the surface of a substrate using two or more co-extrusion heads that co-extrude gridline material and sacrificial material such that the deposited gridline material is compressed between opposing portions of the sacrificial material. The co-extrusion heads include three-channel cavity structures that converge to a relatively small outlet orifice that dispenses the gridline material with relatively fine features and a relatively high aspect ratio. The outlet orifices of the co-extrusion heads are disposed in a staggered arrangement such that gridlines extruded from the first co-extrusion head are disposed between two gridlines extruded from the second co-extrusion head. Photovoltaic cells are produced with metal gridlines formed in this manner.

7 Claims, 9 Drawing Sheets

U.S. PATENT DOCUMENTS

| | | | |
|---|---|---|---|
| 4,153,476 A | 5/1979 | Shelpuk et al. |
| 4,177,083 A | 12/1979 | Kennedy |
| 4,221,468 A | 9/1980 | Macken |
| 4,224,081 A | 9/1980 | Kawamura et al. |
| 4,254,894 A | 3/1981 | Fetters |
| 4,331,703 A | 5/1982 | Lindmayer |
| 4,337,758 A | 7/1982 | Meinel et al. |
| 4,355,196 A | 10/1982 | Chai |
| 4,420,510 A | 12/1983 | Kunkel et al. |
| 4,461,403 A | 7/1984 | Prahs |
| 4,476,165 A | 10/1984 | McIntyre |
| 4,490,418 A | 12/1984 | Yoshida |
| 4,521,457 A | 6/1985 | Russell et al. |
| 4,540,843 A | 9/1985 | Gochermann et al. |
| 4,602,120 A | 7/1986 | Wakefield et al. |
| 4,683,348 A | 7/1987 | Pidgeon et al. |
| 4,746,370 A | 5/1988 | Woolf |
| 4,747,517 A | 5/1988 | Hart |
| 4,792,685 A | 12/1988 | Yamakawa |
| 4,796,038 A | 1/1989 | Allen et al. |
| 4,826,777 A | 5/1989 | Ondris |
| 4,841,946 A | 6/1989 | Marks |
| 4,847,349 A | 7/1989 | Ohta et al. |
| 4,849,028 A | 7/1989 | Krause |
| 4,855,884 A | 8/1989 | Richardson |
| 4,929,281 A | 5/1990 | Woerner |
| 4,938,994 A | 7/1990 | Choinski |
| 4,947,825 A | 8/1990 | Moriarty |
| 4,952,026 A | 8/1990 | Bellman et al. |
| 4,985,715 A | 1/1991 | Cyphert et al. |
| 5,000,988 A | 3/1991 | Inoue et al. |
| 5,004,319 A | 4/1991 | Smither |
| 5,011,565 A | 4/1991 | Dube et al. |
| 5,062,899 A | 11/1991 | Kruer |
| 5,075,281 A | 12/1991 | Testardi |
| 5,089,055 A | 2/1992 | Nakamura |
| 5,120,484 A | 6/1992 | Cloeren |
| 5,151,377 A | 9/1992 | Hanoka et al. |
| 5,167,724 A | 12/1992 | Chiang |
| 5,180,441 A | 1/1993 | Cornwall et al. |
| 5,188,789 A | 2/1993 | Nishiura |
| 5,213,628 A | 5/1993 | Noguchi et al. |
| 5,216,543 A | 6/1993 | Calhoun |
| 5,254,388 A | 10/1993 | Melby et al. |
| 5,344,496 A | 9/1994 | Stern et al. |
| 5,353,813 A | 10/1994 | Deevi et al. |
| 5,356,488 A | 10/1994 | Hezel |
| 5,389,159 A | 2/1995 | Kataoka et al. |
| 5,449,413 A | 9/1995 | Beauchamp et al. |
| 5,501,743 A | 3/1996 | Cherney |
| 5,529,054 A | 6/1996 | Shoen |
| 5,536,313 A | 7/1996 | Watanabe et al. |
| 5,538,563 A | 7/1996 | Finkl |
| 5,540,216 A | 7/1996 | Rasmusson |
| 5,543,333 A | 8/1996 | Holdermann |
| 5,552,820 A | 9/1996 | Genovese |
| 5,559,677 A | 9/1996 | Errichiello |
| 5,560,518 A | 10/1996 | Catterall et al. |
| 5,569,399 A | 10/1996 | Penney et al. |
| 5,590,818 A | 1/1997 | Raba et al. |
| 5,605,720 A | 2/1997 | Allen et al. |
| 5,665,175 A | 9/1997 | Safir |
| 5,679,379 A | 10/1997 | Fabbricante et al. |
| 5,700,325 A | 12/1997 | Watanabe |
| 5,733,608 A | 3/1998 | Kessel et al. |
| 5,873,495 A | 2/1999 | Saint-Germain |
| 5,918,771 A | 7/1999 | van der Heijden |
| 5,929,530 A | 7/1999 | Stone |
| 5,949,123 A | 9/1999 | Le et al. |
| 5,981,902 A | 11/1999 | Arita et al. |
| 5,990,413 A | 11/1999 | Ortabasi |
| 6,011,307 A | 1/2000 | Jiang et al. |
| 6,020,554 A | 2/2000 | Kaminar et al. |
| 6,032,997 A | 3/2000 | Elliott et al. |
| 6,047,862 A | 4/2000 | Davies |
| 6,091,017 A | 7/2000 | Stern |
| 6,118,067 A | 9/2000 | Lashley et al. |
| 6,130,465 A | 10/2000 | Cole |
| 6,140,570 A | 10/2000 | Kariya |
| 6,164,633 A | 12/2000 | Mulligan et al. |
| 6,203,621 B1 | 3/2001 | Tran et al. |
| 6,232,217 B1 | 5/2001 | Ang et al. |
| 6,257,450 B1 | 7/2001 | Jackson et al. |
| 6,274,508 B1 | 8/2001 | Jacobsen et al. |
| 6,278,054 B1 | 8/2001 | Ho et al. |
| 6,293,498 B1 | 9/2001 | Stanko et al. |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,375,311 B1 | 4/2002 | Kuramoto |
| 6,379,521 B1 | 4/2002 | Nishio |
| 6,398,370 B1 | 6/2002 | Chiu et al. |
| 6,407,329 B1 | 6/2002 | Iino et al. |
| 6,410,843 B1 | 6/2002 | Kishi et al. |
| 6,418,986 B1 | 7/2002 | Gabriele |
| 6,420,266 B1 | 7/2002 | Smith et al. |
| 6,423,140 B1 | 7/2002 | Liu et al. |
| 6,429,037 B1 | 8/2002 | Wenham et al. |
| 6,479,395 B1 | 11/2002 | Smith et al. |
| 6,527,964 B1 | 3/2003 | Smith et al. |
| 6,529,220 B1 | 3/2003 | Matsumoto |
| 6,531,653 B1 | 3/2003 | Glenn et al. |
| 6,555,739 B2 | 4/2003 | Kawam |
| 6,558,146 B1 | 5/2003 | Shah et al. |
| 6,568,863 B2 | 5/2003 | Murata |
| 6,590,235 B2 | 7/2003 | Carey et al. |
| 6,597,510 B2 | 7/2003 | Bunkenburg et al. |
| 6,623,579 B1 | 9/2003 | Smith et al. |
| 6,663,944 B2 | 12/2003 | Park et al. |
| 6,666,165 B2 | 12/2003 | Shiraishi et al. |
| 6,667,434 B2 | 12/2003 | Morizane et al. |
| 6,743,478 B1 | 6/2004 | Kiiha et al. |
| 6,890,167 B1 | 5/2005 | Kwok et al. |
| 6,896,381 B2 | 5/2005 | Benitez et al. |
| 6,924,493 B1 | 8/2005 | Leung |
| 7,045,794 B1 | 5/2006 | Spallas et al. |
| 7,101,592 B2 | 9/2006 | Gueggi et al. |
| 7,152,985 B2 | 12/2006 | Benitez et al. |
| 7,160,522 B2 | 1/2007 | Minano Dominguez et al. |
| 7,181,378 B2 | 2/2007 | Benitez et al. |
| 7,388,147 B2 | 6/2008 | Mulligan et al. |
| 7,394,016 B2 | 7/2008 | Gronet |
| 2001/0008230 A1 | 7/2001 | Keicher et al. |
| 2001/0053420 A1 | 12/2001 | Donges et al. |
| 2002/0056473 A1 | 5/2002 | Chandra et al. |
| 2002/0060208 A1 | 5/2002 | Liu et al. |
| 2002/0083895 A1 | 7/2002 | Nakamura et al. |
| 2002/0148497 A1 | 10/2002 | Sasaoka et al. |
| 2002/0149107 A1 | 10/2002 | Chang et al. |
| 2002/0154396 A1 | 10/2002 | Overbeck |
| 2003/0015820 A1 | 1/2003 | Yamazaki et al. |
| 2003/0095175 A1 | 5/2003 | Agorio |
| 2003/0129810 A1 | 7/2003 | Barth et al. |
| 2003/0201581 A1 | 10/2003 | Weber et al. |
| 2003/0232174 A1 | 12/2003 | Chang et al. |
| 2004/0012676 A1 | 1/2004 | Weiner |
| 2004/0031517 A1 | 2/2004 | Bareis |
| 2004/0048001 A1 | 3/2004 | Kiguchi et al. |
| 2004/0070855 A1 | 4/2004 | Benitez et al. |
| 2004/0084077 A1 | 5/2004 | Aylaian |
| 2004/0151014 A1 | 8/2004 | Speakman |
| 2004/0191422 A1 | 9/2004 | Kataoka et al. |
| 2004/0200520 A1 | 10/2004 | Mulligan et al. |
| 2004/0211460 A1 | 10/2004 | Simburger et al. |
| 2004/0259382 A1 | 12/2004 | Nishimura et al. |
| 2004/0265407 A1 | 12/2004 | Prugh et al. |
| 2005/0000566 A1 | 1/2005 | Posthuma et al. |
| 2005/0029236 A1 | 2/2005 | Gambino et al. |
| 2005/0034751 A1 | 2/2005 | Gross et al. |
| 2005/0046977 A1 | 3/2005 | Shifman |
| 2005/0067729 A1 | 3/2005 | Laver et al. |
| 2005/0081908 A1 | 4/2005 | Stewart |
| 2005/0133084 A1 | 6/2005 | Joge et al. |
| 2005/0194037 A1 | 9/2005 | Asai |
| 2005/0221613 A1 | 10/2005 | Ozaki et al. |

| | | | |
|---|---|---|---|
| 2005/0253308 A1 | 11/2005 | Sherwood | |
| 2006/0207650 A1 | 9/2006 | Winston et al. | |
| 2006/0231133 A1 | 10/2006 | Fork et al. | |
| 2006/0251796 A1 | 11/2006 | Fellingham | |
| 2006/0266235 A1 | 11/2006 | Sandhu et al. | |
| 2007/0108229 A1 | 5/2007 | Fork et al. | |
| 2007/0110836 A1 | 5/2007 | Fork et al. | |
| 2008/0047605 A1 | 2/2008 | Benitez et al. | |
| 2008/0138456 A1 | 6/2008 | Fork et al. | |

FOREIGN PATENT DOCUMENTS

| | | | |
|---|---|---|---|
| CN | 1854637 A | | 11/2006 |
| DE | 19735281 A1 | | 2/1999 |
| EP | 0 257 157 A | | 3/1988 |
| EP | 0 851 511 A | | 7/1998 |
| EP | 1 145 797 A | | 10/2001 |
| EP | 1 351 318 A | | 10/2003 |
| EP | 1 715 260 A | | 10/2006 |
| EP | 1 763 086 A | | 3/2007 |
| EP | 1 787 786 A | | 5/2007 |
| EP | 1 833 099 A | | 9/2007 |
| JP | 60082680 A | * | 5/1985 |
| JP | 02 187291 A | | 7/1990 |
| JP | 05-031786 A | | 2/1993 |
| JP | 2002111035 A | | 4/2002 |
| JP | 2004-266023 A | | 9/2004 |
| JP | 2005051216 | | 2/2005 |
| WO | WO 91/08503 A | | 6/1991 |
| WO | 91/15355 | | 10/1991 |
| WO | WO 92/15845 A | | 9/1992 |
| WO | WO 94/28361 A1 | | 12/1994 |
| WO | WO 97/21253 A | | 6/1997 |
| WO | WO 97/48519 A | | 12/1997 |
| WO | WO 00/49421 A1 | | 8/2000 |
| WO | WO 00/49658 A1 | | 8/2000 |
| WO | WO 00/50215 | | 8/2000 |
| WO | WO 02/052250 A | | 7/2002 |
| WO | WO 02/097724 | | 12/2002 |
| WO | WO 03/047005 A | | 6/2003 |
| WO | WO 03/076701 A | | 9/2003 |
| WO | WO 2005/070224 A1 | | 8/2005 |
| WO | WO 2005/107957 A1 | | 11/2005 |
| WO | WO 2005/107958 A1 | | 11/2005 |
| WO | WO 2006/097303 A | | 9/2006 |
| WO | WO 2007/104028 | | 9/2007 |

OTHER PUBLICATIONS

Benitez et al. "High-Concentration Mirror-Based Kohler Integrating System for Tandem Solar Cells", WCPEC2006, 4 pages.
Beit et al. "FLATCON™ and FLASHCON™ Concepts For High Concentration PV", Presented at the 19$^{th}$ European Photovoltaic Solar Energy Conf., Jun. 7-11, 2004, Paris, 4 pages.
Gordon et al. "Optical performance at the thermodynamic limit with tailored imaging designs", Applied Optics, in press, Dec. 2004, 16 pages.
Kenis et al. "Fabrication inside Microchannels Using Fluid Flow", Accounts of Chemical Research, vol. 33, No. 12, 2000, pp. 841-847.
Mulligan et al. "A Fiat-Plate Concentrator: Micro-Concentrator Design Overview", 2000 IEEE, pp. 1495-1497.
Mulligan et al. "Development of Chip-Size Silicon Solar Cells".
Nguyen, Luu "Wafer Level Packaging for Analog/Mixed Signal Applications", MEPTEC Int. Wafer Level Packaging Conference, Aug. 22, 2002, 41 pages.
Sun et al. "Modeling and Experimental Evaluation of Passive Heat Sinks for Miniature High-Flux Photovoltaic Concentrators", Transactions of the ASME, vol. 127, pp. 138-145 (2005).
Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.
Swanson, Richard M. "The Promise of Concentrators", Prog. Photovolt. Res. Appl. 8, pp. 93-111 (2000).
Terao et al. "A Mirror-Less Design for Micro-Concentrator Modules", Conference Record of the 28$^{th}$ IEEE Photovoltaic Specialists Conference (2000) pp. 1416-1419.
Terao, Akira "MicroDish: A Novel Reflective Optic for Flat-Plate Micro-Concentrator", SPIE's 49$^{th}$ Annual Meeting, Aug. 2-6, 2004, Denver, Colorado, USA, 9 pages.
NIJS et al. "Overview of solar cell technologies and results on high efficiency multicrystalline silicon substrates," Solar Energy Materials and Solar Cells, vol. 48, No. 1-4, Nov. 1, 1997, pp. 199-217.
U.S. Appl. No. 11/282,882, filed Nov. 17, 2005, Fork et al.
U.S. Appl. No. 11/282,829, filed Nov. 17, 2005, Fork et al.
U.S. Appl. No. 11/336,714, filed Jan. 20, 2006, Fork et al.
Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.
Cuevas et al. "50 Per Cent More Output Power from an Albedo-Collecting Flat Panel Using Bifacial Solar Cells", Solar Energy, vol. 29, No. 5, pp. 419-420, 1982.
Finlayson et al. "$Bi_2O_3$-$Wo_3$ compounds for photocatalytic applications by solid state and viscous processing", Title from a conference scheduled for Oct. 6-7, 2004 in Munich, 8 pages.
Kerschaver et al. "Back-contact Solar Cells: A Review," Progress in Photovoltaics: Research and Applications, 2006, vol. 14, pp. 107-123.
Kränzl et al. "Bifacial Solar Cells on Multi-Crystalline Silicon", 15$^{th}$ International Photovoltaic Science & Engineering Conference, Shanghai, China, 2 pages, 2005.
Mueller et al. "Breathable Polymer Films Produced by the Microlayer Coextrusion Process", Journal of Applied Polymer Science, vol. 78, pp. 816-828, 2000.
Neuhaus et al. "Industrial Silicon Wafer Solar Cells," Advances in OptoElectronics, vol. 2007, 2007, 15 pages.
Rao et al. "Microfabricated Deposition Nozzles for Direct-Write Assembly of Three-Dimensional Periodic Structures", Advanced Materials, vol. 17, No. 3, Feb. 10, 2005, 5 pages.
Recart et al. "Large Area Thin BSF Solar Cells With Simultaneously Diffused Boron and Phosphorus Screen Printed Emitters", IEEE, pp. 1213-1216, 2005.
Taguchi et al. An Approach for the Higher Efficiency in the HIT Cells, IEEE, pp. 866-871, 2005.
Van Hoy et al. "Microfabrication of Ceramics by Co-extrusion", J. Am. Ceram. Soc., vol. 81, No. 1, pp. 152-158, 1998.
Weber et al. "Modelling of Sliver® Modules Incorporating a Lambertian Rear Reflector", The Australian National University, Canberra ACT 0200, Australia, 4 pages, 2005.
Gimac Compact Triplex TR12 Micro-Coextrusion Plant, NPE 2000, Jun. 19-23, 2000, McCormick Place, Chicago, IL, Booth 13154, http://www.citsco.com/NPE2000/npepagel.html, 2 pages.
Extrusion/Coextrusion Dies, Extrusion Dies Industries, LLC, http://www.extrusiondies.com/PRODUCTS/ExtrusionDies/multimanifoldDies.html, 1 page.
Hitachi: Offering Total Environmental Solutions, Environmental Activities, http://greenweb.hitachi.co.jp/en/sustainable/total-solution.html, 5 pages, 2003.
Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.
SunPower Corp. News Release, May 12, 2008, Available URL: http://investors.sunpowercorp.com/releasedetail.cfm?ReleaseID-309613.
Sparber et al. "Comparison of texturing methods for monocrystalline silicon solar cells using KOH and $Na_2CO_3$," 3$^{rd}$ World Conf. Photovoltaic Energy Conversion, Osaka, 2003, pp. 1372-1375.
MacDonald et al. "Texturing industrial multicrystalline silicon solar cells," Solar Energy, vol. 76, 2004, pp. 277-283.
Tool et al. "Straightforward in-line processing for 16.8% efficient mc-Si solar cells," 31$^{st}$ IEEE Photovoltaic Specialists Conf., Florida, 2005, pp. 1324-1327.
Fukui et al. "17.7% efficiency large area multicrystalline silicon solar cell using screen-printed metallization technique," 31$^{st}$ IEEE Photovoltaic Specialists Conf., Florida, 2005, pp. 979-982.
Mitsubishi Electric Corp., Mitsubishi Electric Develops Practical-Use Multi-Crystalline Silicon Solar Cell with World's Highest Conversion Efficiency Rate of 18.6%, News Release #2432, Tokyo, Mar. 19, 2008, Available URL: http://global.mitsubishielectric.com/news/news_releases/2008/mel0705.pdf.

Zhao et al. "19.8% efficient 'honeycomb' textured multicrystalline and 24.4% monocrystalline silicon solar cells," Applied Physics Letters, vol. 73, pp. 1991-1993, 1998.

Abbott et al. "Optical and Electrical Properties of Laser Texturing for High-efficiency Solar Cells," Progress in Photovoltaics: Research and Applications, Published online Jan. 5, 2006, vol. 14, pp. 225-235, 2006.

Brogren et al. "Optical properties, durability, and system aspects of a new aluminum-polymer-laminated steel reflector for solar concentrators", Jan. 2004, Solar Energy Materials and Solar Cells, 82, pp. 387-412.

Mauk et al. "'Buried' Metal/Dielectric/Semiconductor Reflectors for Light Trapping in Epitaxial Thin-Film Solar Cells", May 1996, IEEE, 25th PVSC, pp. 147-150.

Munzer et al. "Thin Monocrystalline Silicon Solar Cells, Oct. 1999, IEEE Transactions on Electron Devices", vol. 46, No. 10, pp. 2055-2061.

Knight et al. "Hydrodynamic Focusing on a Silicon Chip: Mixing Nanoliters in Microseconds", Physical Review Letters, vol. 80, No. 17, Apr. 27, 1998, pp. 3863-3866.

Raabe et al. "High Aspect Ratio Screen Printed Fingers", 20th European Solar Energy Conference and Exhibition, Barcelona, Spain, Jun. 6-10, 2005, 4 pgs.

Bejan, Adrian. "Chapter Five, Buckling Flows: A New Frontier in Fluid Mechanics", Annual Review of Numerical Fluid Mechanics and Heat Transfer, vol. 1, Ed. T. C. Chawla, Hemisphere Publishing Corporation, 1987, pp. 262-304.

Liang et al. "Co-Extrusion of Solid Oxide Fuel Cell Functional Elements", Ceramic Engineering and Science Proceedings, vol. 20, No. 4, 1999, pp. 587-594.

Shannon et al. "The Production of Alumina/Zirconia Laminated Composites by Co-Extrusion", Ceramic Engineering and Science Proceedings, vol. 16, No. 5, 1955, pp. 1115-1120.

Kenis et al. "Microfabrication Inside Capillaries Using Multiphase Laminar Flow Patterning", Science, vol. 285, Jul. 2, 1999, pp. 83-85.

Szlufcik et al. "Low-Cost Industrial Technologies of Crystalline Silicon Solar Cells", Proc. of the IEEE, vol. 85, No. 5, May 1, 1997, pp. 711-730.

Ruthe et al. "Etching of $CuInSe_2$ Thin Films-Comparison of Femtosecond and Picosecond Laser Ablation", Applied Surface Science, vol. 247, No. 1-4, Jul. 15, 2005, pp. 447-452.

\* cited by examiner

APPARATUS FOR FORMING A PLURALITY OF HIGH-ASPECT RATIO GRIDLINE STRUCTURES

FIELD OF THE INVENTION

The present invention is related to extrusion systems and methods, and more particularly to micro extrusion systems and methods for co-extruding multiple similar and/or dissimilar materials to form relatively fine structures with relatively high aspect ratios.

BACKGROUND

With traditional extrusion a billet of material is pushed and/or drawn through a die to create a rod, rail, pipe, etc. Various applications leverage this capability. For instance, extrusion can be used with food processing applications to create pasta, cereal, snacks, etc., pipe pastry filling (e.g., meringue), pattern cookie dough on a cookie pan, generate pastry flowers and borders on cakes, etc. In another application, extrusion can be used with consumer goods, for example, to merge different colored toothpastes together on a toothbrush.

Conventional extrusion techniques are limited, for example, in that they cannot render relatively high aspect-ratio (e.g., 2:1 or greater) fine featured (e.g., less than 50 micron) or porous structures. Thus, extrusion typically is not used for creating conducting contacts and/or channels for electrochemical (e.g., fuel), solar, and/or other types of cells, which leverage high aspect-ratio fine featured porous structures to increase efficiency and electrical power generation.

By way of example, with fuel cells, high aspect-ratio fine featured porous electrolyte structures provide a long reaction zone that increases utilization of the expensive catalyst needed for the electrode. In addition, fuel cells can be complex structures since they perform multiple functions including: conducting protons from the membrane to the reaction site; diffusing oxygen to the reaction site with a low partial pressure drop; conducting electrons from the porous electrode to the reaction site; carrying heat away from the reaction site; and withstanding a compressive mechanical load in a range of about 100 to 200 PSI. Conventional extrusion techniques cannot meet these demands at a cost demanded by the fuel cell industry. In order to increase efficiency, fuel cell manufacturers use more catalyst than desired to increase the number of reaction sites and make agglomerates of carbon catalyzed with Platinum (Pt) in a matrix of porous, or polytetrafluoroethylene (PTFE). With solar cells, high aspect-ratio fine featured grid lines reduce the amount of shading, which allows more photons to be captured, resulting in an increased electrical power generation. Conventional extrusion techniques are not able to produce such gridlines at a cost demanded by the solar cell industry.

There are many other practical devices that benefit from rapid and economical means for generating high aspect ratio lines and features. FIG. 12 shows, by way of example, a plasma display panel as an example of a device that incorporates barrier ribs that define the sub-pixels within the display. The barrier rib is an electrically insulating structure, and is preferably a high aspect ratio structure, as this improves the dot per inch resolution and fill factor of the display.

What is needed is a system and method for efficiently producing closely spaced, high aspect-ratio gridlines that can be used, for example, in the production of high quality photovoltaic cells and plasma display panels.

SUMMARY OF THE INVENTION

The present invention is directed to an apparatus and a method for forming closely spaced high-aspect ratio gridline structures on a substrate surface in which the gridlines are co-extruded with a sacrificial material onto the substrate surface such that the high-aspect ratio gridline is supported between two sacrificial material portions (the sacrificial portions are subsequently removed). The formation of such co-extruded structures requires the compression of the gridline material between the two sacrificial material portions, which requires the use of a relatively wide three-channel cavity feeding a relatively narrow outlet orifice in a manner that compresses the gridline material between the two sacrificial material portions. Due to the width of the three-channel cavity, the spacing between adjacent outlet orifices on each head (and, hence, the pitch of the extruded gridlines) is larger than the optimal gridline pitch used, for example, in solar cells. According to the present invention, the relatively wide spacing between adjacent outlet orifices is compensated by disposing multiple co-extrusion heads in a parallel arrangement such that their respective outlet orifices are disposed in a staggered (offset) arrangement. When the assembly is subsequently moved over the substrate and co-extruded materials are forced from the respective outlet orifices, the interspersed parallel gridlines are produced that have a desired (relatively small) pitch. When the sacrificial material is subsequently removed, the resulting closely-spaced, high aspect ratio gridlines are provided on the substrate surface.

In accordance with a specific embodiment of the present invention, a method for producing photovoltaic cells includes forming a suitable semiconductor substrate, and then forming closely spaced high aspect-ratio metal gridlines on a surface of the substrate in the manner described above.

BRIEF DESCRIPTION OF THE DRAWINGS

These and other features, aspects and advantages of the present invention will become better understood with regard to the following description, appended claims, and accompanying drawings, where:

DETAILED DESCRIPTION

Figure 1:
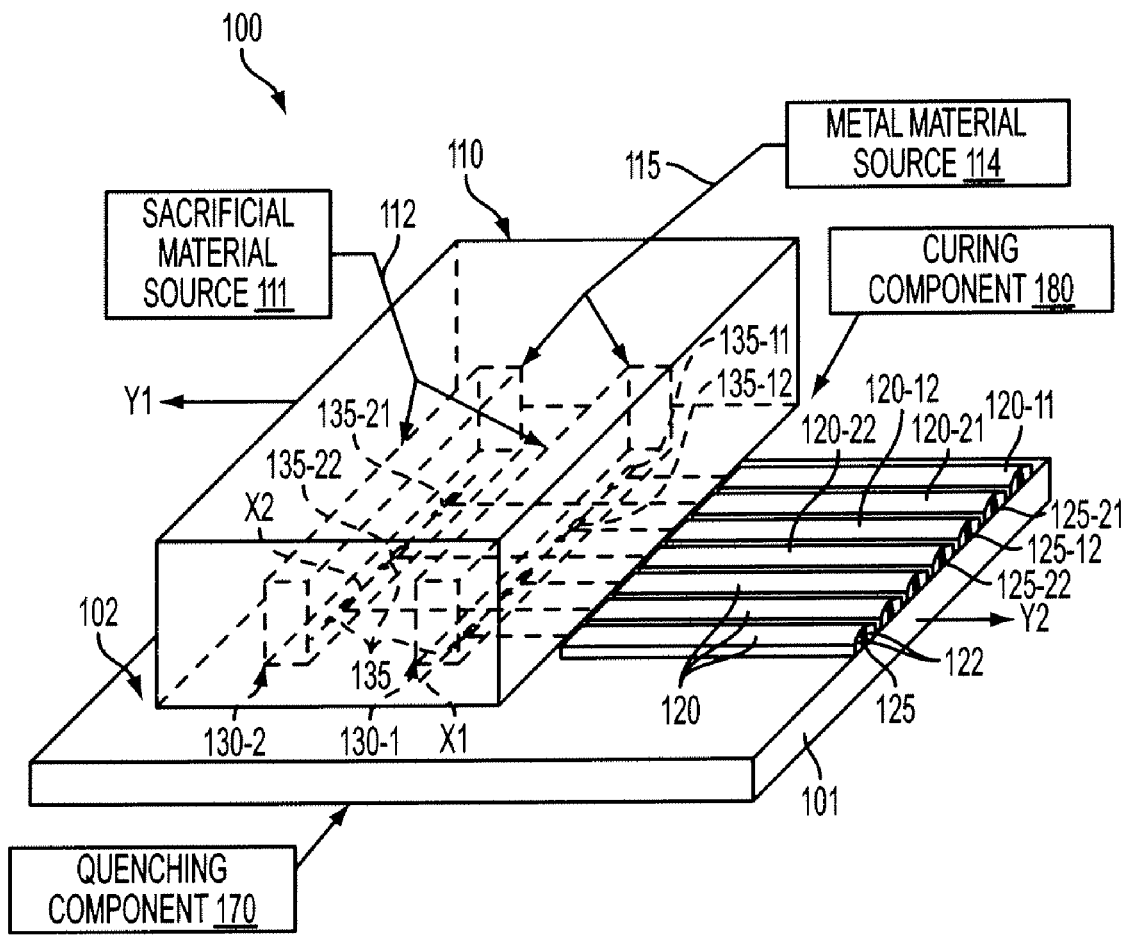
FIG. 1 is a perspective view showing an extrusion apparatus with an head for concurrently applying two or more materials on a substrate.

FIG. 1 illustrates an extrusion apparatus 100 including an extrusion device 110 including two or more co-extrusion heads 130-1 and 130-2 fixedly mounted thereon. Extrusion device 110 is coupled to a first source 111 containing a sacrificial material 112, and a second source 114 containing a gridline material 115. Extrusion heads 130-1 and 130-2 are operably coupled to sources 111 and 114 such that heads 130-1 and 130-2 concurrently apply sacrificial material 112 and a gridline material 115 onto the upper surface 102 of a substrate 101. The materials are applied through pushing and/or drawing techniques (e.g., hot and cold) in which the materials are pushed (e.g., squeezed, etc.) and/or drawn (e.g., via a vacuum, etc.) through extrusion device 110 and/or co-extrusion heads 130-1 and 130-2, and out one or more outlet orifices (exit ports) 135 that are respectively defined in a lower portion of co-extrusion heads 130-1 and 130-2.

In accordance with an aspect of the invention, co-extrusion heads 130-1 and 130-2 are held by extrusion device 110 such that their respective outlet orifices are arranged in a parallel, spaced-apart arrangement. In particular, the (first) outlet orifices of co-extrusion head 130-1 (e.g., outlet orifices 135-11 and 135-12) extending in a first direction X1, and the (second) outlet orifices of the second co-extrusion head 130-2 (e.g., outlet orifices 135-21 and 135-22) define a second line X2 that is separated from and parallel to first line X1.

In accordance with another aspect of the present invention, apparatus 100 includes a mechanism (not shown) for moving extrusion device 110 (and, hence, co-extrusion heads 130-1 and 130-2) in a direction that is perpendicular to the alignment direction of the outlet orifices. In one embodiment, moving extrusion device 110 relative to substrate 101 involves fixedly mounting substrate 101, and utilizing a positioning mechanism to move extrusion device 110 in a direction Y1 over surface 102 such that outlet orifices 135 are maintained at a fixed distance from surface 102. In an alternative embodiment, moving extrusion device 110 relative to substrate 101 involves mounting device 110 to a rigid fixture, and utilizing a conveyor or other mechanism to move substrate 101 in a direction Y2 under outlet orifices 135.

In accordance with another aspect of the present invention, while extrusion device 110 is being moved relative to substrate 101, gridline material 112 and sacrificial material 115 are co-extruded through outlet orifices 135 in a manner that creates parallel, elongated extruded structures 120 on substrate 101 such that the gridline material of each structure 120 forms a high-aspect ratio gridline structure 125, and the sacrificial material of each structure 120 forms associated first and second sacrificial material portions 122 respectively disposed on opposing sides of the associated high-aspect ratio gridline 125. The shape of extruded structures 120 (i.e., the aspect ratio of gridline 125 and the shape of sacrificial portions 122) are controllable through at least one of the shapes of the one or more outlet orifices 135, the structure within the heads 130-1 and 130-2 (e.g., channels), characteristics of the materials (e.g., viscosity, etc.), and the extrusion technique (e.g., flow rate, pressure, temperature, etc.). The structure within heads 130-1 and 130-2 and the shape of outlet orifices 135 are described in additional detail below. Suitable gridline materials 115 include, but are not limited to, silver, copper, nickel, tin, aluminum, steel, alumina, silicates, glasses, carbon black, polymers and waxes, and suitable sacrificial materials 112 include plastic, ceramic, oil, cellulose, latex, polymethylmethacrylate etc., combinations thereof, and/or variations thereof, including combining the above with other substances to obtain a desired density, viscosity, texture, color, etc.

In accordance with another aspect of the present invention, the (first) outlet orifices of co-extrusion head 130-1 and the (second) outlet orifices of co-extrusion head 130-2 are disposed in a staggered arrangement such that extrusion structures 120 extruded by co-extrusion head 130-1 are disposed between two extrusion structures extruded by co-extrusion head 130-2. For example, extrusion structure 120-12, which is extruded from outlet orifice 135-12 of extrusion head 130-1, is disposed between extrusion structures 120-21 and 120-22, which are extruded from outlet orifices 135-21 and 135-22 of extrusion head 130-2. As described in additional detail below, by utilizing two or more parallel extrusion heads (e.g., heads 130-1 and 130-2) to simultaneously generate extrusion structures 120, closely spaced high aspect-ratio gridlines 125 are formed on substrate 101 at a pitch that is not possible using conventional methods.

Referring again to FIG. 1, to limit the tendency for the materials to intermix after extrusion, extruded structures 120 leaving extrusion heads 130-1 and 130-2 can be quenched on substrate 101 by cooling the substrate using, for example, a quenching component 170. Alternately, the ink used in this application may be a hot-melt material, which solidifies at ambient temperatures, in which case the printheads 130-1 and 130-2 are heated, leaving the extruded structures 120 to solidify once they are dispensed onto the substrate 101. In another technique, the materials can be cured by thermal, optical and/or other means upon exit from extrusion heads 130-1 and 130-2. For example, a curing component 180 can be provided to thermally and/or optically cure the materials. If one or both materials include an ultraviolet curing agent, the material can be bound up into solid form in order to enable further processing without mixing.

Figure 2:
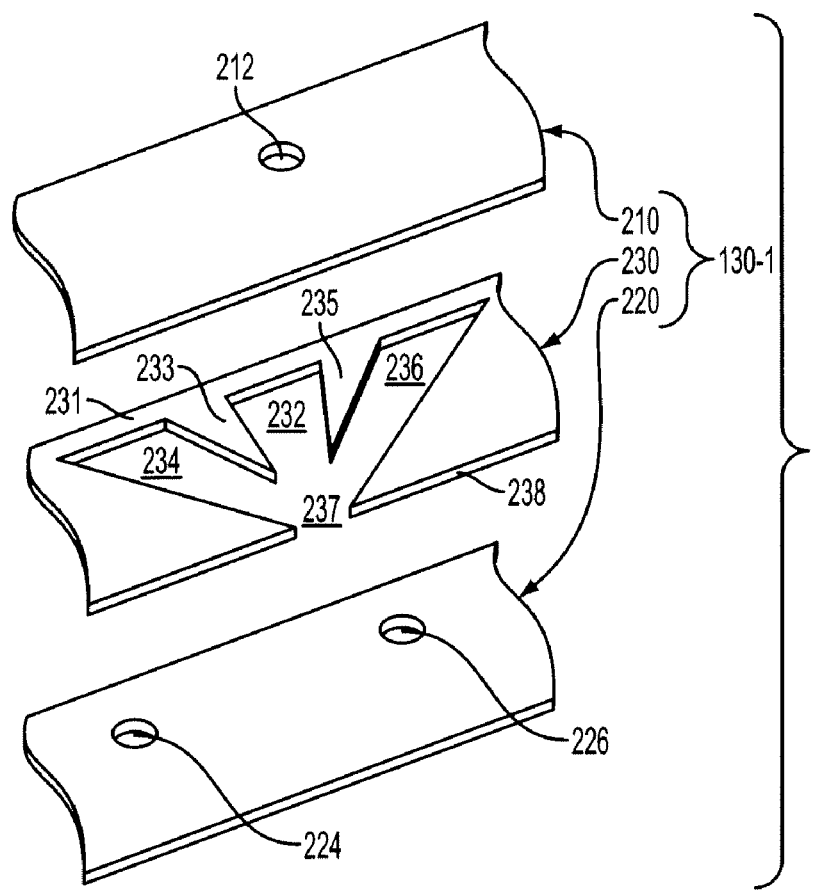
FIG. 2 is an exploded perspective view showing a portion of a co-extrusion head utilized in the apparatus of FIG. 1.
Figure 3:
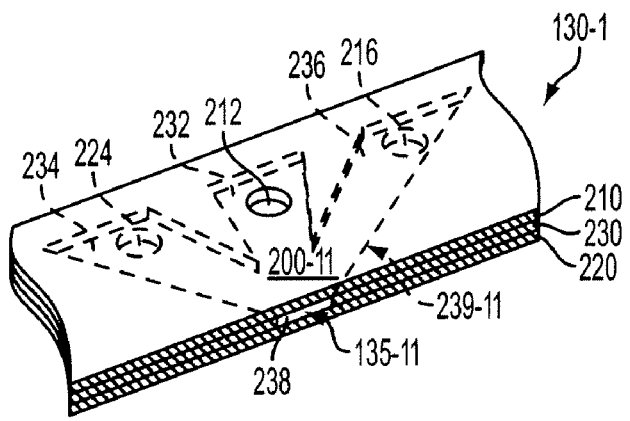
FIG. 3 is an assembled perspective view showing the portion of the co-extrusion head of FIG. 2 after manufacture.

FIGS. 2 and 3 are exploded perspective and assembled perspective views showing an exemplary three-channel cavity 200-11 defined in co-extrusion head 130-1. Referring briefly to FIG. 1, three-channel cavity 200-11 is utilized to produce extruded structure 120-11 by way of outlet orifice 135-11. Three-channel cavity 200-11 is representative of the structural features employed in extrusion heads 130-1 and 130-2 to produce the multiple extrusion structures 120 shown in FIG. 1.

Referring to FIG. 2, in accordance with an embodiment of the present invention, co-extrusion head 130-1 includes an upper sheet metal layer 210, a lower sheet metal layer 220, and a central sheet metal layer 230. Central metal layer 230 is micro-machined (e.g., using deep reactive ion etching) to include an end structure 231 and an arrowhead-shaped opening including a central channel 232 and opposing (first and second) side channels 234 and 236. Central channel 232 is separated from side channel 234 by a first tapered finger 233, and is separated from side channel 236 by a second tapered finger 235. Central channel 232 has a closed end that is defined by end structure 231 and tapered fingers 233 and 235, and an open end that communicates with an opening 237 defined in a side edge 238 of plate 230. Similarly, side channels 234 and 236 have associated closed ends that are defined by end structure 231 and tapered fingers 233 and 235, and open ends that communicate with opening 237. Side channels 234 and 236 are angled toward central channel 232, and converge adjacent opening 237. Upper metal plate 210 defines a first inlet port (through hole) 212, and lower metal plate 220 defines second and third inlet ports 224 and 226. Inlet ports 212, 224 and 226 are formed, for example, using the same micro-machining techniques used to form three-channel cavity 231-11.

FIG. 3 shows the portion of head 130-1 of FIG. 2 after plates 210, 220 and 230 are bonded using known high pressure wafer bonding techniques to define three-channeled cavity 200-11. First inlet port 212 is aligned with the closed end of central channel 232, and second and third inlet ports 224 and 226 are aligned with the closed ends of side channels 234 and 236, respectively. As described below in additional detail, metal and sacrificial materials are introduced into three-channel cavity 231 through inlet ports 212, 224 and 226. Additional metal plates (not shown) may be utilized to conduct the metal and sacrificial materials to the inlet ports 212, 224 and 226 in a manner that minimizes the number of material feedlines attached to each extrusion head. A method for fabricating head 130-1 is described in co-owned and co-pending U.S. patent application Ser. No. 11/555,512, entitled "EXTRUSION HEAD WITH PLANARIZED EDGE SURFACE", which is incorporated herein by reference in its entirety.

In addition to the laminated metal layer arrangement depicted in FIGS. 2 and 3, extrusion head 130-1 can be manufactured a variety of ways. In another embodiment, the extrusion heads can be manufactured by electroplating metal up through features in a patterned resist structure. In another instance, the heads can be manufactured by brazing together layers of etched sheet metal. In yet another instance, the heads can be manufactured by generating structures out of photo-definable polymer such as SU8. In still another instance, the heads can be machined or molded out of metal and/or plastic using conventional manufacturing techniques. Moreover, in addition to the specific gridline structures described herein, extrusion heads 130-1 and 130-2 may be modified to produce gridline structures having an equilibrium shape, as described in co-owned and co-pending U.S. patent application Ser. No. 11/555,496, entitled "EXTRUDED STRUCTURE WITH EQUILIBRIUM SHAPE", which is incorporated herein by reference in its entirety.

Figure 4A:
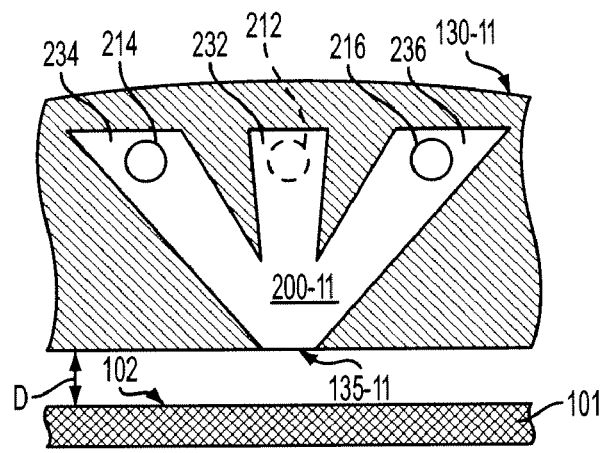
FIGS. 4(A) and 4(B) are cross-sectional side views showing a three-channel cavity defined in the co-extrusion head of FIG. 3.

FIG. 4(A) shows a portion of co-extrusion head 130-1 positioned over substrate 101 prior to generation of metal gridlines. Co-extrusion head 130-1 is maintained at a substantially fixed distance D over upper surface 102 of substrate 101 during the extrusion process (i.e., while co-extrusion head 130-1 is moved relative to substrate 101 in the manner described above). The distance D between the head 130-11 and the substrate 101 can be based on various factors, such as the angle of the dispensing end of the head 130-11 with respect to upper surface 102 (e.g., from parallel to perpendicular), in order to increase transfer efficiency, entity definition (e.g., width, height, length, diameter, etc), entity characteristics (e.g., strength, pliability, etc.), etc. Note that distance D must be greater than or equal to the height H (shown in FIG. 5) of extruded structure 120-11 in order to facilitate the staggered extrusion head arrangement shown in FIG. 1.

Figure 4B:
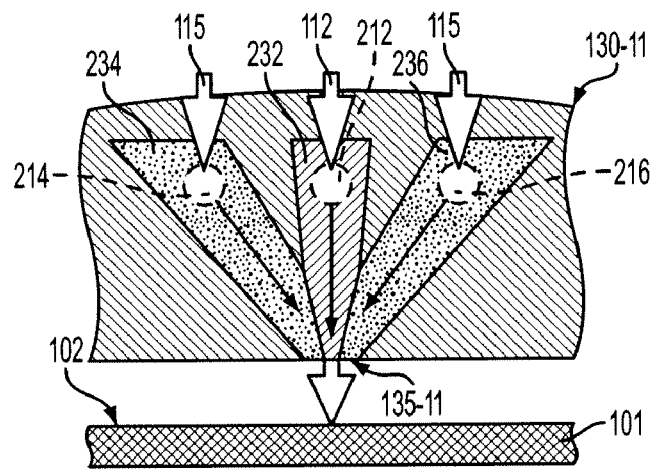

FIG. 4(B) shows the same portion of co-extrusion head 130-1 at the onset of the co-extrusion process. As indicated by the white arrows, gridline material 112 is forcibly injected through the first inlet port 212 into the closed end of central channel 232, and sacrificial material 115 is simultaneously forcibly injected through inlet ports 224 and 226 into side channels 234 and 236, respectively. As indicated by the dark arrows in FIG. 4(B), the injected materials travel downward along their respective channels. The gridline and sacrificial materials are compressed by the tapered shapes channels 232, 234 and 236. The gridline material is further compressed by the converging sacrificial material flowing along side channels 234 and 236 as the materials approach outlet orifice 135-11. The compressed flow is then extruded from outlet orifice 135-11 and is deposited on substrate 101 as extruded structure 120-11 (shown in FIG. 5). Intermixing between the gridline and sacrificial materials is minimized by choosing appropriate materials and viscosities, by appropriately tapering the channels, and/or by maintaining laminar flow conditions.

Figure 5:
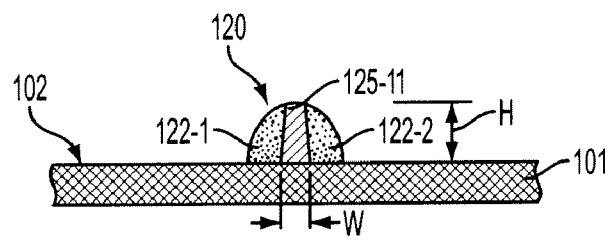
FIG. 5 is a cross-sectional side view showing an exemplary co-extruded gridline structure that was generated on a substrate surface by the co-extrusion head of FIG. 4(B)

FIG. 5 is a cross-sectional side view showing an exemplary extruded structure 120-11 produced in accordance with the co-extrusion process described with reference to FIG. 4(B). Extruded structure 120-11 includes a gridline 125-11 disposed between sacrificial support material portions 122-1 and 122-2. Due to the converging forces generated by three-channel cavity 200-11 (FIGS. 4(A) and 4(B)) leading to outlet 135-11, extruded structure 120-11 exhibits advantages over gridlines formed by conventional methods. For example, extrusion head 130-1 facilitates the formation of gridline 125-11 with an aspect ratio (height H to width W) of 10:1 or greater in a single pass, which is not possible using conventional methods. The width W of gridline 125-11 can be made narrower (finer) than the smallest minimum design feature of extruder head 130-11. Sacrificial material portions 122-1 and 122-2 are maintained along the sides of gridline 125-11 only as long as it is needed to maintain the shape of gridline 125-11 on substrate 101 before or during subsequent processing such as drying, curing, and/or sintering. A further advantage of sacrificial material portions 122-1 and 122-2 is that the added material leads to an overall larger outlet orifice, and hence a lower pressure drop for a given material flow speed. Higher process speed is therefore achievable. In addition, the compressing flow can be manipulated to form metal gridline 125-11 with a tapered cross-section (e.g., with a relatively wide base disposed on substrate surface 102, a relatively narrow upper end, and tapered sides that extend at an angle relative to surface 102 from the base end to the upper end). This tapered shape facilitates directing photons into substrate 101, and reduces the photon blocking (shading) caused by the gridlines, which can improve efficiency and/or generation of electrical power.

Figure 6:
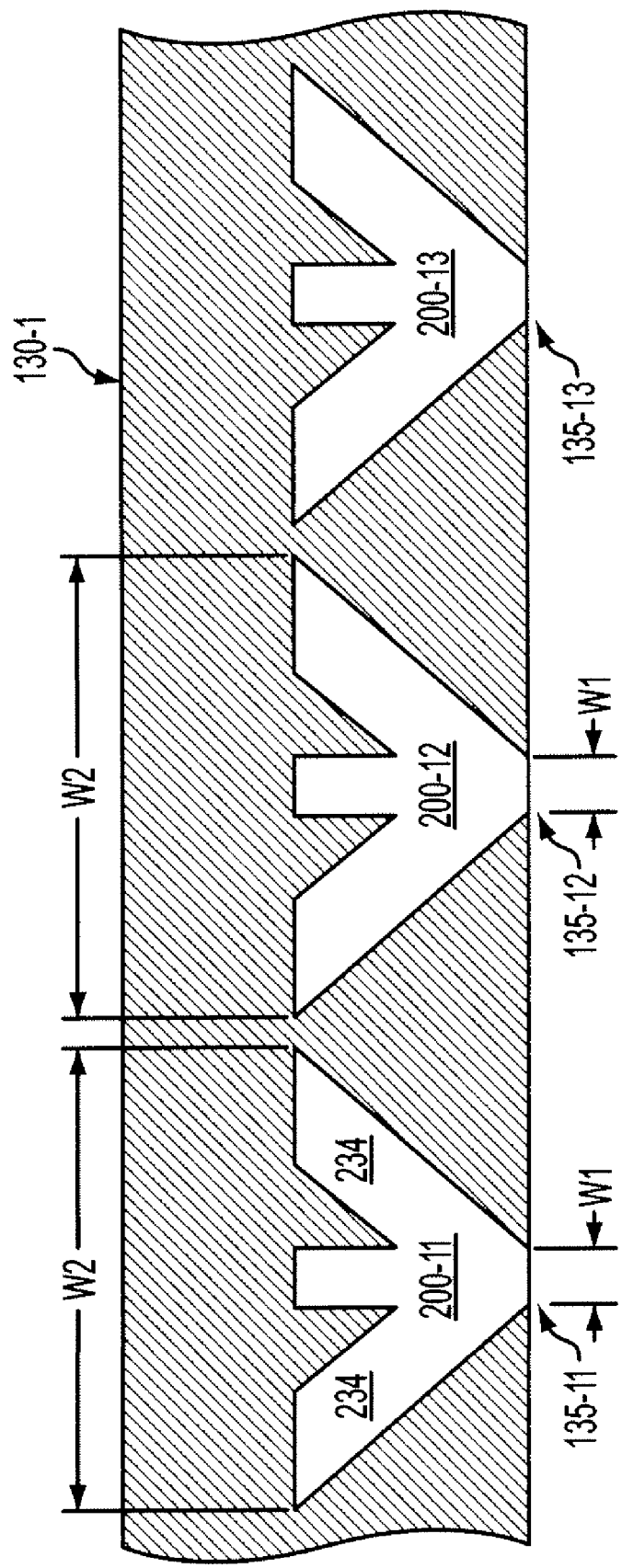
FIG. 6 is a cross-sectional side view showing a larger portion of the co-extrusion head of FIG. 4.
Figure 7:
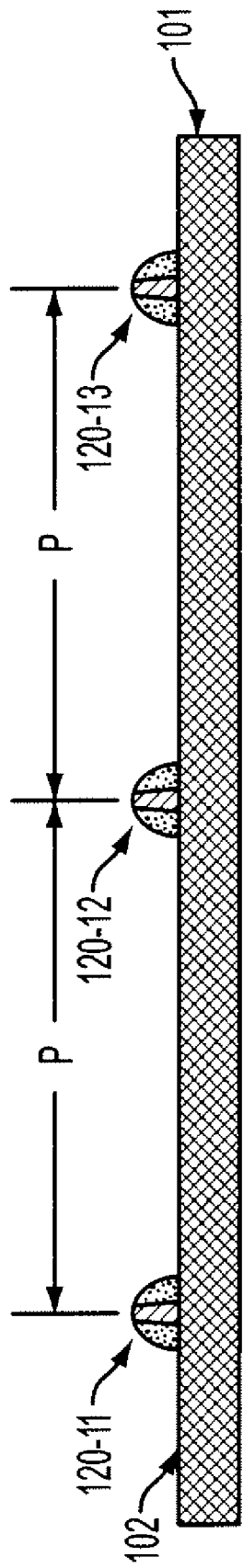
FIG. 7 is a cross-sectional side view showing a series of co-extruded gridline structures generated by the co-extrusion head of FIG. 6.

FIG. 6 is a cross-sectional view showing a larger portion of extrusion head 130-1, and FIG. 7 depicts a series of extrusion structures 120-11, 120-12 and 120-13 that are produced extrusion head 130-1 in the manner described above.

Referring to FIG. 7, a spacing P between adjacent extrusion structures 120-11 to 120-13 extruded from a single co-extrusion head (e.g., head 130-1) is limited by the spacing between the adjacent outlet orifices, which in turn is limited by the upstream space needed to form the three channels of each three-channel cavity. This wide upstream space is shown in FIG. 6, where extrusion head 130-1 includes adjacent three-channel cavities 200-11, 200-12, and 200-13 that respectively define outlet orifices 135-11, 135-12 and 135-13. The inlet ports associated with channel cavities 200-11, 200-12, and 200-13 are omitted for clarity. As indicated in FIG. 6, in contrast to the relatively narrow width W1 of outlet orifice 135-11, a relatively large width W2 is needed to define channels 232 and 234 of three-channel cavity 200-11. As such, the spacing between each adjacent orifice pair of extrusion head 130-1 (e.g., orifices 135-11 and 135-12, or orifices 135-12 and 135-13) is limited by the relatively wide region required to form the associated three-channel cavity that feeds into the orifices. Returning to FIG. 7, as a result, the spacing P between adjacent extrusion structures 120-11 to 120-13 is necessarily relatively wide (i.e., it is not possible to produce co-extrusion structures 120 using a single co-extrusion head).

Figure 8:
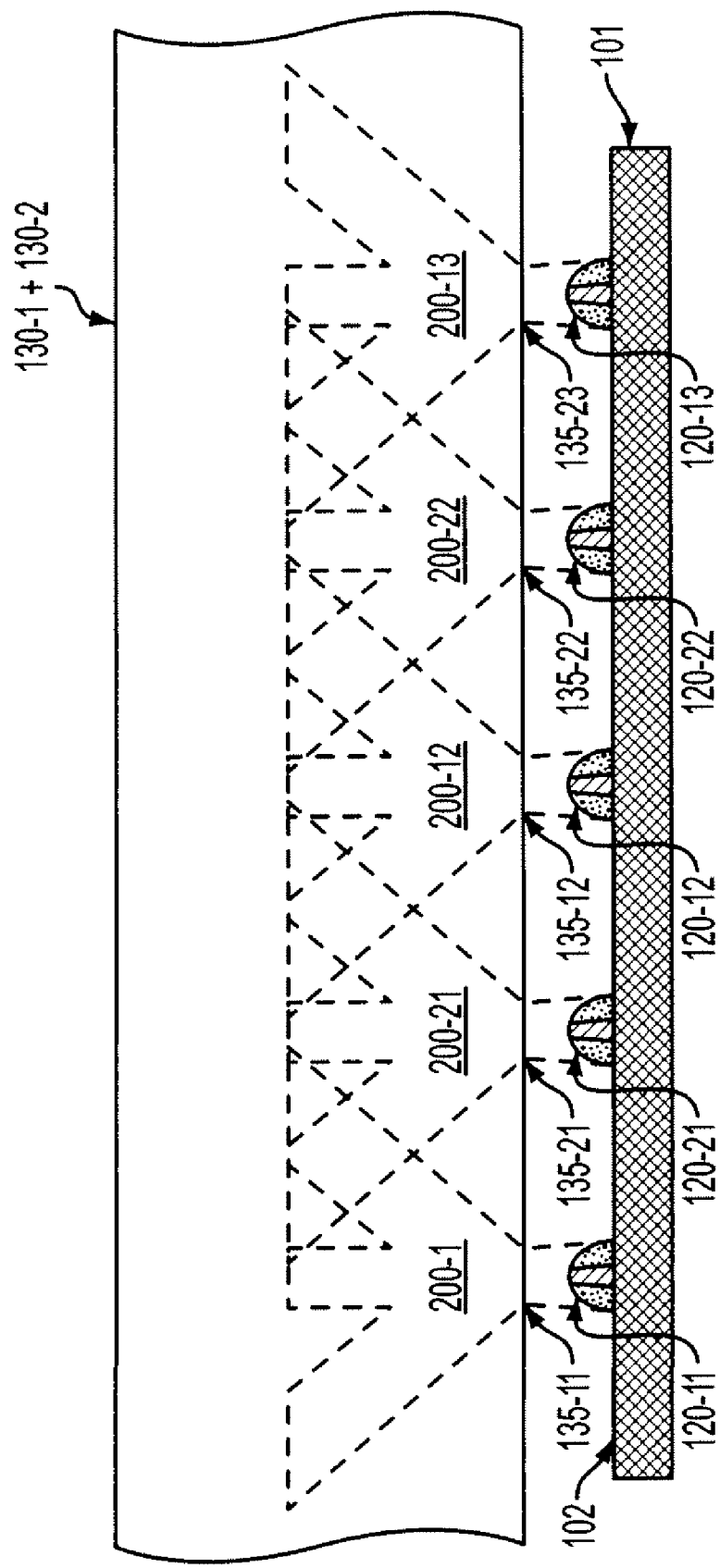
FIG. 8 is an elevation view showing multiple co-extrusion heads in a staggered arrangement and closely spaced gridline structures generated by the multiple co-extrusion heads according to an aspect of the present invention.

FIG. 8 is a side view depicting co-extrusion heads 130-1 and 130-2 in a staggered arrangement that facilitates the production of closely spaced gridlines structures on substrate 101 according to an embodiment of the present invention. In particular, in a manner consistent with that shown in FIG. 1, co-extrusion heads 130-1 and 130-2 are fixedly held over substrate 101 in a parallel arrangement, with their respective outlet orifices aligned in a staggered arrangement such that at least one extrusion structure extruded from co-extrusion head 130-1 is disposed between two extrusion structures extruded from co-extrusion head 130-2. By way of example, as indicated in FIG. 8, outlet orifice 135-12 of co-extrusion head 130-1 produces extrusion structure 120-12, which is disposed between extrusion structures 120-21 and 120-22, which are extruded by outlet orifices 135-21 and 135-22, respectively, of co-extrusion head 130-2. In this manner, a distance between adjacent extrusion structures (and, hence, their associated gridlines) is reduced to P/2, as indicated at the bottom of FIG. 8. Thus, by arranging co-extrusion heads 130-1 and 130-2 in a staggered arrangement, extrusion structures produced by the extrusion apparatus 100 of FIG. 1 have a finer pitch and higher aspect-ratio that those produced using conventional methods, thereby facilitating the production of, for example, superior photovoltaic cells.

Figure 9:
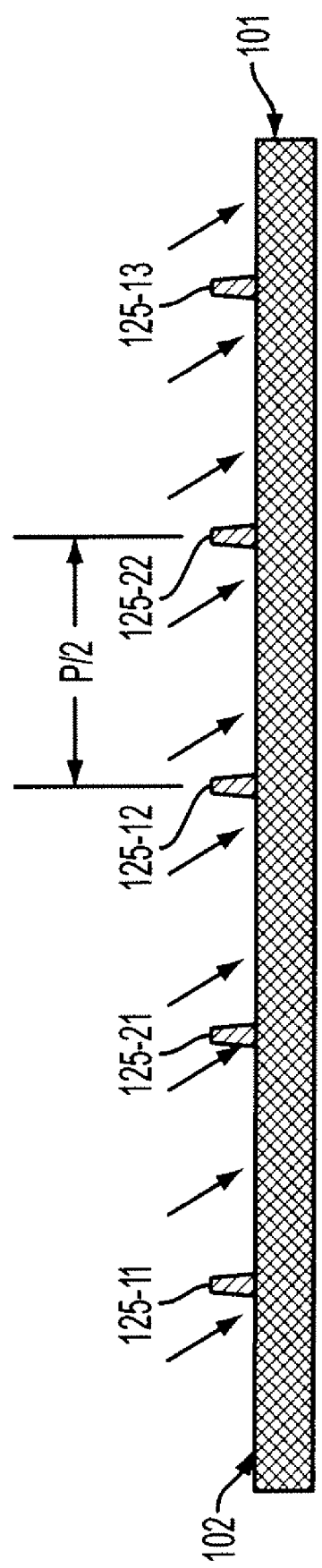
FIG. 9 is a cross-sectional view showing a plurality of metal gridlines formed on a substrate according to another aspect of the present invention.

FIG. 9 is a cross-sectional side view depicting the removal of sacrificial material using a suitable etchant (indicated by slanted lines), thereby completing the process of forming closely spaced, high aspect-ratio gridlines 125-11, 125-21, 125-12, 125-22, and 125-13 on upper surface 102.

In some applications, including the manufacture of solar cell gridlines, the preferred means to remove the sacrificial material is through evaporation and combustion during the firing process. This process also consolidates the metal particles in the gridline material (metal paste consisting of silver particles, a glass frit, a solvent such as terpineol, and fillers such as cellulose) into a conducting mass. In one embodiment, the firing step also causes the metal paste to fire through the insulating passivation layer on the surface of the solar cell, often aided by glass frit particles in the paste, in order to make electrical contact to the semiconductor layer.

Figure 10:
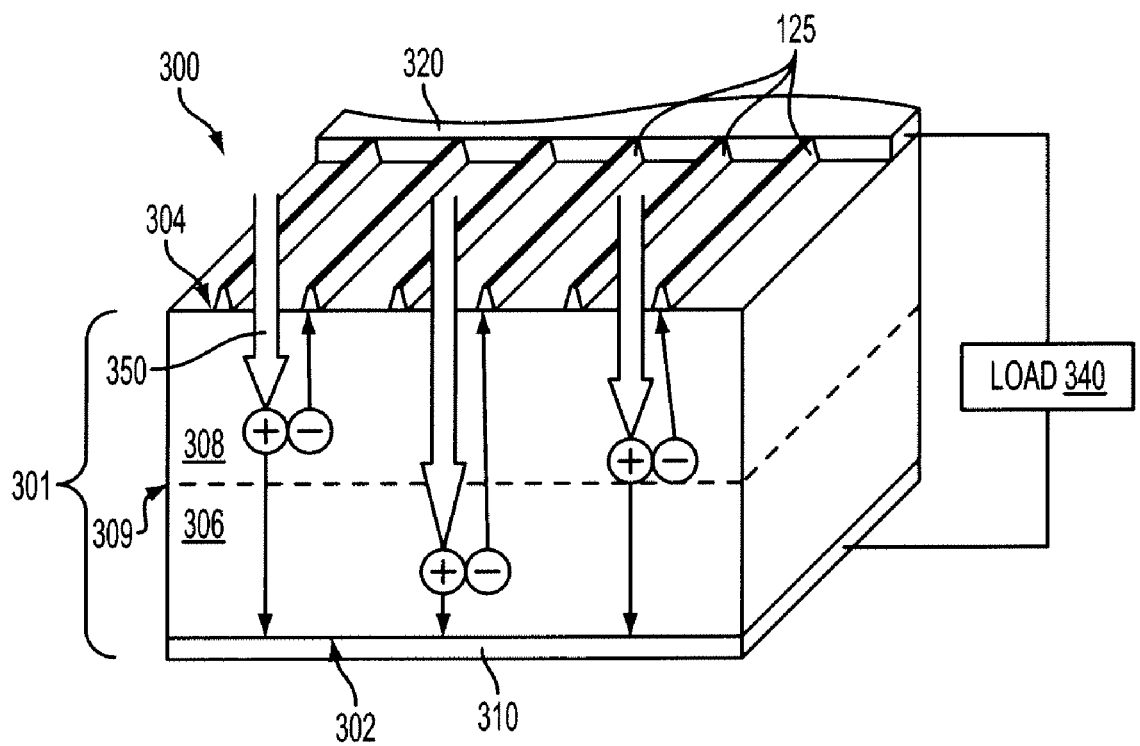
FIG. 10 illustrates a photovoltaic cell including gridlines formed in accordance with the present invention.

FIG. 10 illustrates an exemplary portion of a photovoltaic cell 300, such as a solar cell, with high-aspect metal gridlines 125 created via co-extrusion heads 130-1 and 130-2. Photovoltaic cell 300 includes a semiconductor substrate 301 with a p-type region 306 and an n-type region 308. One or both of the regions 306 and 308 of substrate 301 is formed from semiconductor materials such as, for example, Aluminium Arsenide, Aluminium Gallium Arsenide, Boron Nitride, Cadmium Sulfide, Cadmium Selenide, Copper Indium Gallium Selenide, Diamond, Gallium Arsenide, Gallium Nitride, Germanium, Indium Phosphide, Silicon, Silicon Carbide, Silicon Germanium, Silicon on insulator, Zinc Sulfide, Zinc Selenide, etc. A lower contact 310 is formed on a lower surface 302 of substrate 301 (i.e., at a lower end of p-type region 306). Metal gridlines 125 and one or more bus bars 320 are formed on an upper surface 304 of substrate 301 (i.e., at a lower end of n-type region 308). Contact 310 and bus bars 320 can be formed using a metal paste such as a silver or an aluminum based paste.

Photovoltaic cell 300 can be interconnected with other photovoltaic cells (not shown) in series and/or parallel, for example, via flat wires or metal ribbons, and assembled into modules or panels and connected as indicated to a load 340. A sheet of tempered glass (not shown) may be layered over the gridlines 125 and/or a polymer encapsulation (not shown) may be formed over the contact 310. Upper surface 304 may include a textured surface and/or be coated with an antireflection material (e.g., silicon nitride, titanium dioxide, etc.) in order to increase the amount of light absorbed into the cell.

During operation, when photons 350 (indicated by wide arrows) are directed into substrate 301 through upper surface 304, their energy excites electron-hole pairs therein, which subsequently freely move. In particular, absorption of a photon creates an electric current through the p-n junction (depicted by the migrating + and − charges). Electrical current is generated when excited electrons in the n-type region 308 travel through gridlines 125, bus bar 320, and the electrodes to external load 340 and back through the lower electrode and contact 310 to the p-type region 306.

Figure 11:
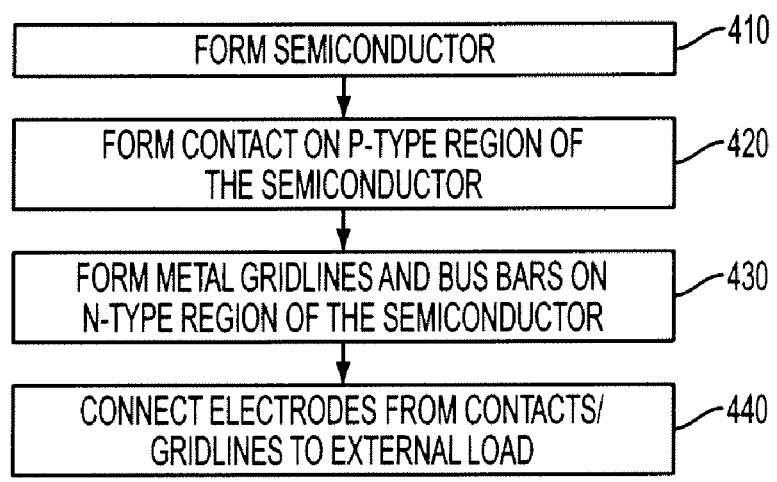
FIG. 11 is a flow diagram showing a simplified method of forming a photovoltaic cell according to another embodiment of the present invention.

FIG. 11 illustrates a method for fabricating a photovoltaic device such as photovoltaic cell 300 described in connection with FIG. 10. At reference numeral 410, semiconductor substrate 301 (FIG. 10) is formed. Substrate 301 can include various semiconductor materials as described above, and may be formed by coupling a piece of n-type silicon with a piece of p-type silicon, or by diffusing an n-type dopant (e.g., Phosphorus, Arsenic, Antimony, etc.) and/or a p-type dopant (e.g., Boron, etc.) is diffused into a silicon wafer. In yet another instance, naturally occurring semiconductors such as blue diamonds, which contain Boron impurities, can be used. One or more of the photovoltaic cells can optionally be coupled in a serial and/or parallel manner to create a photovoltaic module or panel. At reference numeral 420, conducting contact is formed on lower surface 302 using known techniques. At 430, a metal gridlines 125 (and bus bars 320) are formed on upper surface 304 using the methods described above. At 440, electrodes are coupled from conducting contact 310 and gridlines 125 to load 340 in the manner shown in FIG. 10. When photons are absorbed into the semiconductor, electrical energy is generated via the photovoltaic effect.

By way of example, a co-extrusion head with the estimated parameters illustrated in Table 1 could be used to dispense the materials to make gridlines 125 on a crystalline silicon solar cell.

TABLE 1

| Exemplary head parameters for generating a gridline. | |
| --- | --- |
| Sheet Thickness | 152 microns |
| Gridline Pitch | 2.5 mm |
| Head Speed | 1 cm/sec |
| Past Viscosity | 100,000 Cp |
| Head Angle | 45 degrees |
| Head Exit Width | 304.8 Microns |
| Silver Width | 49.2 microns |
| Silver Line Cross Section | 7,500 microns^2 |
| Silver Line Aspect Ratio | 3.10:1 |
| Silver Flow | 0.075 mm^3/sec |
| Head Compression | 6.2:1 |
| Head Pressure Drop | 2.24 atm |

With this design, convergent channels are patterned into a sheet of material with a thickness of approximately 0.15 mm. The outlet orifices of the head/nozzles are repeated on a pitch of 2.5 mm. At a head/nozzle pressure of approximately 2.24 atmospheres, paste of 1000 poise is ejected at a rate of 1 cm/sec. The central stripe of silver is approximately 50 microns wide with an aspect ratio of 3:1.

Figure 12:
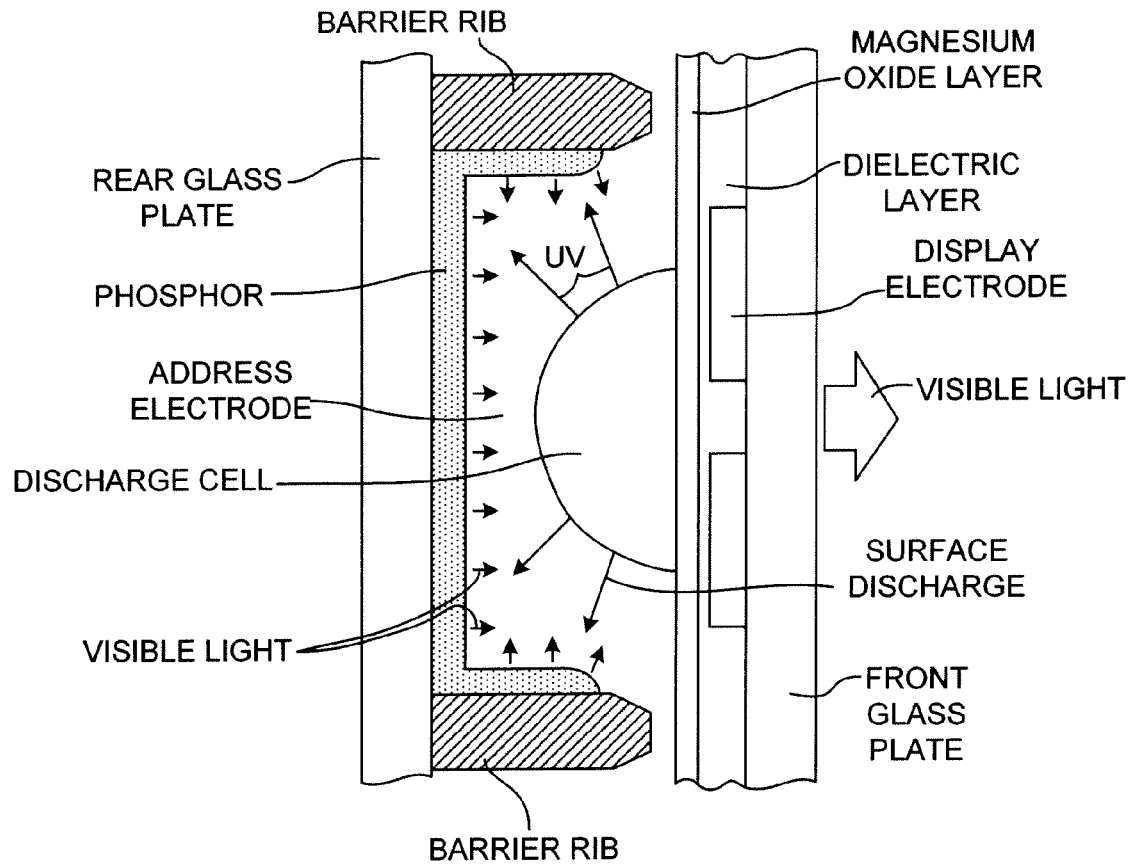
FIG. 12 is a simplified cross-sectional side view showing a portion of an exemplary plasma display panel.

Although the present invention has been described with respect to certain specific embodiments, it will be clear to those skilled in the art that the inventive features of the present invention are applicable to other embodiments as well, all of which are intended to fall within the scope of the present invention. For example, in addition to striped materials with a lateral variation, variations of heads 130-1 and 130-2 may be used to additionally and/or alternatively introduce materials with a vertical variation, for example, for introducing barrier layers onto the substrate. Such vertical variation can be implemented by forming channels that converge dissimilar materials together in the vertical direction (in addition to converging in the horizontal direction) within the manifold. For instance, with a solar cell application, it may be advantageous to introduce a metal bi-layer onto the cell surface with one metal making contact to the silicon as a diffusion barrier, and a second metal on top selected for either lower cost or higher conductance. Further, in addition to metal gridlines, the methods and structures described herein may be utilized to generate gridlines formed from electrically non-conductive materials, such as inorganic glasses that are used, for example, to produce the barrier rib structures described with reference to FIG. 12.

The invention claimed is:

1. An apparatus for forming a plurality of high-aspect ratio gridline structures on a substrate, the apparatus comprising:
    first and second co-extrusion heads positioned over a surface of the substrate such that first outlet orifices of the first co-extrusion head define a first line extending is a first direction, and second outlet orifices of the second co-extrusion head define a second line that is parallel to the first line, wherein each of the first and second co-extrusion heads comprises a plurality of multi-channel cavities, each of the multi-channel cavities including a first channel and a second channel that converge at an output portion such that both the first channel and the second channel communicate with an associated outlet orifice of said first and second outlet orifices;
    first means for forcing a gridline material into the first channel of each of the plurality of multi-channel cavities of the first and second co-extrusion heads and second means for forcing and a sacrificial material into the second channel of each of the plurality of multi-channel cavities of the first and second co-extrusion heads such that both the gridline material and the sacrificial material are co-extruded through each of the first and second outlet orifices; and
    means for moving the first and second co-extrusion heads relative to the substrate in a second direction such that said gridline material extruded from each of the first and second outlet orifices forms an associated gridline structure of said plurality of high-aspect ratio gridline structures, and said sacrificial material extruded from each of the first and second outlet orifices forms associated first and second sacrificial material portions respectively disposed on opposing sides of said associated gridline structure,
    wherein the first and second co-extrusion heads are positioned such that the first said outlet orifices and the second said outlet orifices are disposed in a staggered arrangement such that a first said gridline structure extruded from the first co-extrusion head is disposed between second and third said gridline structures extruded from the second co-extrusion head.

2. The apparatus of claim 1, further comprising an extrusion device coupled to a source of the sacrificial material and a source of the gridline material, wherein the first and second co-extrusion heads are fixedly mounted on the extrusion device.

3. The apparatus of claim 2, wherein said means for moving the first and second co-extrusion heads comprises means for fixedly securing the substrate, and means for moving the extrusion device over the surface of the substrate.

4. The apparatus of claim 2, wherein said means for moving comprises means for fixedly securing the extrusion device, and means for moving the substrate under the extrusion device.

5. The apparatus of claim 1, further comprising at least one of means for heating the gridline and sacrificial materials before extrusion, means for cooling the substrate during extrusion of the gridline and sacrificial materials, and means for curing the extruded gridline and sacrificial materials.

6. The apparatus of claim 1, wherein each multi-channel cavity of the pluralities of multi-channel cavities of the first and second co-extrusion heads comprises a three-channel cavity, each of the three-channel cavities including said central channel and opposing first and second side channels, wherein the central channel and first and second side channels communicate with said associated outlet orifice,
    and wherein the first means for forcing the gridline material into the first channel includes means for injecting the gridline material into the central channel of each three-channel cavity and the second means for forcing the sacrificial material into the second channel includes means for injecting the sacrificial material into the first and second side channels of said three-channel cavity while the gridline material is being injected into the central channel.

7. The apparatus of claim 6,
    wherein each said three-channel cavity is defined between a first plate portion having a first inlet port disposed over the central channel of the three-channel cavity, and a second plate portion having second and third inlet ports respectively disposed over the first and second side channels of the three-channel cavity, and
    wherein said means for injecting the gridline material comprises means for forcing the gridline material through the first inlet port into the central channel and said means for injecting the sacrificial material comprises means for forcing the sacrificial material through the second and third inlet ports into the first and second side channels.

* * * * *